(12) United States Patent
Merricks et al.

(10) Patent No.: US 6,660,153 B2
(45) Date of Patent: Dec. 9, 2003

(54) SEED LAYER REPAIR BATH

(75) Inventors: David Merricks, Coventry (GB); Denis Morrissey, Huntington, NY (US); Martin W. Bayes, Hopkinton, MA (US); Mark Lefebvre, Hudson, NH (US); James G. Shelnut, Northboro, MA (US); Donald E. Storjohann, Watertown, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 115 days.

(21) Appl. No.: 09/982,398

(22) Filed: Oct. 17, 2001

(65) Prior Publication Data

US 2002/0088713 A1 Jul. 11, 2002

Related U.S. Application Data

(60) Provisional application No. 60/242,234, filed on Oct. 20, 2000.

(51) Int. Cl.$^7$ .................................................. C25D 5/02
(52) U.S. Cl. ....................................... 205/115; 205/122
(58) Field of Search ................................. 205/115, 118, 205/122, 123, 157

(56) References Cited

U.S. PATENT DOCUMENTS

| | | | | |
|---|---|---|---|---|
| 5,004,525 A | * | 4/1991 | Bernards et al. | 205/291 |
| 5,328,589 A | * | 7/1994 | Martin | 205/296 |
| 6,277,263 B1 | * | 8/2001 | Chen | 205/182 |
| 6,354,916 B1 | * | 3/2002 | Uzoh et al. | 451/41 |

* cited by examiner

Primary Examiner—Patrick Ryan
Assistant Examiner—Thomas H. Parsons
(74) Attorney, Agent, or Firm—S. Matthew Cairns

(57) ABSTRACT

Disclosed are methods for repairing seed layers prior to subsequent metallization during the manufacture of electronic devices.

15 Claims, No Drawings

SEED LAYER REPAIR BATH

This application claims the benefit of Provisional application No. 60/242,234 filed Oct. 20, 2000.

FIELD OF THE INVENTION

1. Background of the Invention

This invention relates generally to the field of seed layers for subsequent metallization. In particular, this invention relates to methods for repairing seed layers prior to metallization.

2. Description of the Related Art

The trend toward smaller microelectronic devices, such as those with sub-micron geometries, has resulted in devices with multiple metallization layers to handle the higher densities. One common metal used for forming metal lines, also referred to as wiring, on a semiconductor wafer is aluminum. Aluminum has the advantage of being relatively inexpensive, having low resistivity, and being relatively easy to etch. Aluminum has also been used to form interconnections in vias to connect the different metal layers. However, as the size of via/contact holes shrinks to the sub-micron region, a step coverage problem appears which in turn can cause reliability problems when using aluminum to form the interconnections between the different metal layers. Such poor step coverage results in high current density and enhances electromigration.

One approach to providing improved interconnection paths in the vias is to form completely filled plugs by using metals such as tungsten while using aluminum for the metal layers. However, tungsten processes are expensive and complicated, tungsten has high resistivity, and tungsten plugs are susceptible to voids and form poor interfaces with the wiring layers.

Copper has been proposed as a replacement material for interconnect metallizations. Copper has the advantages of improved electrical properties as compared to tungsten and better electromigration property and lower resistivity than aluminum. The drawbacks to copper are that it is more difficult to etch as compared to aluminum and tungsten and it has a tendency to migrate into the dielectric layer, such as silicon dioxide. To prevent such migration, a barrier layer, such as titanium nitride, tantalum nitride and the like, must be used prior to the depositing of a copper layer.

Typical techniques for applying a metal layer, such as electrochemical deposition, are only suitable for applying copper to an electrically conductive layer. Thus, an underlying conductive seed layer, typically a metal seed layer such as copper, is generally applied to the substrate prior to electrochemically depositing copper. Such seed layers may be applied by a variety of methods, such as physical vapor deposition ("PVD") and chemical vapor deposition ("CVD"). Typically, seed layers are thin in comparison to other metal layers, such as from 50 to 1500 angstroms thick.

U.S. Pat. No. 5,824,599 (Schacham-Diamand et al.) discloses a method of preventing oxide formation on the surface of a copper seed layer by conformally blanket depositing under vacuum a catalytic copper layer over a barrier layer on a wafer and then, without breaking the vacuum, depositing a protective aluminum layer over the catalytic copper layer. Such blanket deposition of a copper layer under vacuum is typical of such procedures used commercially.

PCT patent application number WO 99/47731 (Chen) discloses a method of providing a seed layer by first vapor depositing an ultra-thin seed layer followed by electrochemically enhancing the ultra-thin seed layer to form final a seed layer. The copper seed layer is enhanced by using an alkaline electrolytic bath. According to this patent application, such a two step process provides a seed layer having reduced discontinuities, i.e. areas in the seed layer where coverage of the seed layer is incomplete or lacking. However, one using this method to enhance a seed layer would have to rinse and neutralize the seed layer before using conventional acidic electrolytic plating baths. In addition, a manufacturer using such alkaline enhancement method in combination with an acid electroplating bath would have to double the number of plating heads on the plating tool or throughput would decrease.

European Patent Application EP 952 242 A1 (Landau et al.) discloses low acid ($\leq 0.4$ M) and high copper ($>0.8$ M) containing electroplating baths for void-free filling of small recessed features. Repair of seed layers is not disclosed.

Thus, there is a continuing need for methods of repairing seed layers having oxidation and discontinuities, particularly for use in devices having small geometries, such as 0.5 micron and below.

SUMMARY OF THE INVENTION

It has been surprisingly found that acidic electroplating solutions may be used to repair copper seed layer by providing seed layers substantially free of discontinuities prior to subsequent metallization.

In one aspect, the present invention provides a method of providing a metal seed layer substantially free of discontinuities disposed on a substrate including the steps of contacting a metal seed layer disposed on a substrate with an electroplating bath including one or more sources of copper ions and an electrolyte, wherein the copper ions are present in an amount up to 10 g/L.

In a second aspect, the present invention provides a method of manufacturing an electronic device including the step of contacting a metal seed layer disposed on a substrate with an electroplating bath including one or more sources of copper ions and an electrolyte, wherein the copper ions are present in an amount up to 10 g/L.

In a third aspect, the present invention provides an electroplating bath including one or more sources of copper ion and an electrolyte, wherein the copper ions are present in an amount of up to 10 g/L.

In a fourth aspect, the present invention provides an article of manufacture including an electronic device substrate containing one or more apertures, each aperture containing a seed layer deposit obtained from an electroplating composition that includes one or more sources of copper ion and an electrolyte, wherein the copper ions are present in an amount of up to 10 g/L.

In a fifth aspect, the present invention provides a method for removing excess material from a semiconductor wafer containing one or more apertures by using a chemical mechanical planarization process which includes contacting the semiconductor wafer with a rotating polishing pad thereby removing the excess material from the semiconductor wafer; wherein the apertures contain a seed layer deposit obtained from an electroplating composition that includes one or more sources of copper ion and an electrolyte, wherein the copper ions are present in an amount of up to 10 g/L.

DETAILED DESCRIPTION OF THE INVENTION

As used throughout the specification, the following abbreviations shall have the following meanings, unless the context clearly indicates otherwise: nm=nanometers; g/L= grams per liter; μm=micron=micrometer; ASF=amperes per square foot; M=molar; and ppm=parts per million.

As used throughout the specification, "feature" refers to the geometries on a substrate, such as, but not limited to, trenches and vias. "Apertures" refer to recessed features, such as vias and trenches. The term "small features" refers to features that are one micron or smaller in size. "Very small features" refers to features that are one-half micron or smaller in size. Likewise, "small apertures" refer to apertures that are one micron or smaller in size and "very small apertures" refer to apertures that are one-half micron or smaller in size. As used throughout this specification, the term "plating" refers to metal electroplating, unless the context clearly indicates otherwise. "Deposition" and "plating" are used interchangeably throughout this specification. The term "accelerator" refers to a compound that enhances the plating rate. The term "suppressor" refers to a compound that suppresses the plating rate. "Halide" refers to fluoride, chloride, bromide, and iodide.

All percentages and ratios are by weight unless otherwise indicated. All ranges are inclusive and combinable.

The present invention provides certain dilute electroplating baths that are capable of providing seed layers, particularly copper or copper alloy seed layers, that are substantially free of discontinuities or voids. The present electroplating baths are particularly suitable for use in the manufacture of electronic devices, and particularly in the manufacture of integrated circuits.

Electroplating solutions of the present invention generally include one or more sources of copper ions, and an acidic electrolyte. The electroplating solutions of the present invention may optionally contain one or more additives, such as halides, accelerators or brighteners, suppressors, levelers, grain refiners, wetting agents, surfactants and the like.

A variety of copper salts may be employed in the subject seed layer repair electroplating solutions as sources of copper ions. Suitable copper salts include, but are not limited to, copper sulfates, copper acetates, copper fluoroborate, and cupric nitrates. Copper sulfate pentahydrate is particularly suitable. The electroplating baths of the present invention are operated at high dilution compared to conventional copper electroplating baths. Thus, in the present electroplating baths, copper ions are present in an amount up to about 10 g/L, and preferably up to about 8 g/L. Particularly suitable seed layer electroplating baths are those containing from about 1 to about 6 g/L of copper ions.

The seed layer repairing electroplating baths may also contain amounts of other alloying elements, such as, but not limited to, tin, zinc, and the like. Thus, the copper electroplating baths useful in the present invention may deposit copper or copper alloy.

Plating baths of the invention employ an acidic electrolyte, which may include one or more acids. Preferred electrolytes include two acids or three acids, and more preferably two acids. Suitable acids are inorganic or organic. Thus, when more than one acid is used in the present seed layer repair electroplating baths, the two or more acids may be two or more inorganic acids, two or more organic acids, or a mixture of inorganic and organic acids. Suitable inorganic acids include, but are not limited to, sulfuric acid, phosphoric acid, nitric acid, hydrogen halide acids, sulfamic acid, fluoroboric acid and the like. Suitable organic acids include, but are not limited to, alkylsulfonic acids such as methanesulfonic acid, aryl sulfonic acids such as phenyl-sulfonic acid and tolylsulfonic acid, carboxylic acids such as formic acid, acetic acid and propionic acid, halogenated acids such as trifluoromethylsulfonic acid and haloacetic acid, and the like. Particularly suitable organic acids include ($C_1$–$C_{10}$)alkylsulfonic acids. Particularly suitable combinations of acids include one or more inorganic acids with one or more organic acids or a mixture of two or more organic acids.

Suitable mixtures of acids include, but are not limited to, sulfuric acid/methane sulfonic acid, fluoroboric acid/trifluoromethanesulfonic acid, sulfuric acid/methanesulfonic acid/phenylsulfonic acid, nitric acid/sulfuric acid/methanesulfonic acid, methanesulfonic acid/ethanesulfonic acid/phenylsulfonic acid, methanesulfonic acid/ethanesulfonic acid, methanesulfonic acid/ethanesulfonic acid/sulfiuric acid, sulfuric acid/acetic acid/methanesulfonic acid, sulfuric acid/methanesulfonic acid/propionic acid, trichloroacetic acid/sulfuric acid, trichloroacetic acid/sulfuifc acid/metbanesulfonic acid, trichloroacetic acid/sulfuric acid/phenylsulfonic acid, and the like.

Typically, the two or more acids may be present in any ratio. For example, when two acids are used, they may be present in any ratio from 99:1 to 1:99. Preferably, the two acids are present in a ratio from 90:10 to 10:90, more preferably from 80:20 to 20:80, still more preferably from 75:25 to 25:75, and even more preferably from 60:40 to 40:60. When three or more acids are used, they may be used in any ratio. The two or more acids in the present electrolytes are not intended to include the minor amounts (typically less than 100 mg/L) of hydrogen halide acids conventionally used as a source of halide ions.

As the present seed layer repair baths are operated at high dilution, the total amount of added acid used in such baths is less than that used in conventional copper electroplating baths. Thus, the electrolyte may contain from 0 to about 70 g/L of added, and preferably from about 10 to about 70 g/L. When two inorganic acids are used, it is preferred that each acid be present in an amount of at least about 0.5 g/L, preferably at least about 1 g/L, and more preferably at least about 2 g/L. It will be appreciated by those skilled in the art that by using a metal sulfate as the metal ion source, an acidic electrolyte can be obtained without any added acid. Thus, if a metal sulfate is used, only one additional acid needs to be added to provide an electrolyte having two or more acids. If a hydrogen halide acid is used, it is preferably used in an amount greater than 50 mg/L, more preferably greater than or equal to 100 mg/L, still more preferably greater than or equal to 200 mg/L, and even more preferably greater than or equal to 500 mg/L.

For certain applications it may be advantageous that the total amount of added acid be low. By "low acid" is meant that the total amount of added acid in the electrolyte is less than about 0.4 M, preferably less than about 0.3 M, and more preferably less than about 0.2 M.

The present electrolytes may optionally contain one or more halides, and preferably do contain at least one halide. Chloride and bromide are preferred halides, with chloride being more preferred. A wide range of halide ion concentrations (if a halide ion is employed) may be suitably utilized, e.g. from about 0 (where no halide ion employed) to 100 ppm of halide ion in the plating solution, more preferably from about 25 to about 75 ppm. Such halides may be added as the corresponding hydrogen halide acid or as any suitable salt.

A wide variety of brighteners (or accelerators), including known brightener agents, may be employed in the present electroplating compositions. Typical brighteners contain one or more sulfur atoms, and typically without any nitrogen atoms and a molecular weight of about 1000 or less. Brightener compounds that have sulfide and/or sulfonic acid groups are generally preferred, particularly compounds that comprise a group of the formula R'—S—R—SO$_3$X, where R is an optionally substituted alkyl (which include cycloalkyl), optionally substituted heteroalkyl, optionally substituted aryl group, or optionally substituted heteroalicyclic; X is a counter ion such as sodium or potassium; and R' is hydrogen or a chemical bond (i.e. —S—R—SO$_3$X or substituent of a larger compound). Typically alkyl groups will have from one to about 16 carbons, more typically one to about 8 or 12 carbons. Heteroalkyl groups will have one or more hetero (N, O or S) atoms in the chain, and preferably have from 1 to about 16 carbons, more typically 1 to about 8 or 12 carbons. Carbocyclic aryl groups are typical aryl groups, such as phenyl and naphthyl. Heteroaromatic groups also will be suitable aryl groups, and typically contain 1 to about 3 N, O or S atoms and 1–3 separate or fused rings and include e.g. coumarinyl, quinolinyl, pyridyt, pyrazinyl, pyrimidyl, furyl, pyrrolyl, thienyl, thiazolyl, oxazolyl, oxidizolyl, triazole, irnidazolyl, indolyl, benzofuranyl, benzothiazol, and the like. Heteroalicyclic groups typically will have 1 to 3 N, O or S atoms and from 1 to 3 separate or fused rings and include e.g. tetrahydroftiranyl, thienyl, tetrahydropyranyl, piperdinyl, morpholino, pyrrolindinyl, and the like. Substituents of substituted alkyl, heteroalkyl, aryl or heteroalicyclic groups include e.g. C$_{1-8}$ alkoxy; C$_{1-8}$ alkyl, halogen, particularly F, Cl and Br; cyano, nitro, and the like.

More specifically, useful brighteners include those of the following formulae:

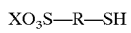

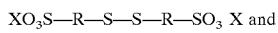

where in the above formulae R is an optionally substituted alkyl group, and preferably is an alkyl group having from 1 to 6 carbon atoms, more preferably is an alkyl group having from 1 to 4 carbon atoms; Ar is an optionally substituted aryl group such as optionally substituted phenyl or naphthyl; and X is a suitable counter ion such as sodium or potassium.

Some specific suitable brighteners include e.g. N,N-dimethyl-dithiocarbamic acid-(3-sulfopropyl)ester; 3-mercapto-propylsulfonic acid-(3-sulfopropyl)ester; 3-mercaptopropylsulfonic acid (sodium salt); carbonic acid-dithio-o-ethylester-s-ester with 3-mercapto-1-propane sulfonic acid (potassium salt); bissulfopropyl disulfide; 3-(benzthiazolyl-s-thio)propyl sulfonic acid (sodium salt); pyridiniun propyl sulfobetaine; 1-sodium-3-mercaptopropane-1-sulfonate; sulfoalkyl sulfide compounds disclosed in U.S. Pat. No. 3,778,357; the peroxide oxidation product of a dialkyl amino-thiox-methyl-thioalkanesulfonic acid; and combinations of the above. Additional suitable brighteners are also described in U.S. Pat. Nos. 3,770,598, 4,374,709, 4,376,685, 4,555,315, and 4,673,469, all incorporated herein by reference. Particularly preferred brighteners for use in the plating compositions of the invention are N,N-dimethyldithiocarbamic acid-(3-sulfopropyl)ester and bis-sodium-sulfonopropyl-disulfide.

The amount of such accelerators present in the electroplating baths is in the range of from about 0.1 to about 1000 ppm. Preferably, the accelerator compounds are present in an amount of from about 0.5 to about 300 ppm, more preferably from about 1 to about 100 ppm, and still more preferably from about 2 to about 50 ppm.

The suppressor agents useful in the compositions of the invention are polymeric materials, preferably having heteroatom substitution, particularly oxygen linkages. Generally preferred suppressor agents are generally high molecular weight polyethers, such as those of the following formula:

where R is an aryl or alkyl group containing from about 2 to 20 carbon atoms; each X, Y, X' and Y' is independently hydrogen, alkyl preferably methyl, ethyl or propyl, aryl such as phenyl; aralkyl such as benzyl; and preferably one or more of X, Y, X' and Y' is hydrogen; and n is an integer between 5 and 100,000. Preferably, R is ethylene and n is greater than 12,000.

The amount of such suppressors present in the electroplating baths is in the range of from about 0.1 to about 1000 ppm. Preferably, the suppressor compounds are present in an amount of from about 0.5 to about 500 ppm, and more preferably from about 1 to about 200 ppm.

Surfactants may optionally be added to the electroplating baths. Such surfactants are typically added to copper electroplating solutions in concentrations ranging from about 1 to 10,000 ppm based on the weight of the bath, more preferably about 5 to 10,000 ppm. Particularly suitable surfactants for plating compositions of the invention are commercially available polyethylene glycol copolymers, including polyethylene glycol copolymers. Such polymers are available from e.g. BASF (sold by BASF under TETRONIC and PLURONIC tradenames), and copolymers from Chemax.

Levelers may optionally be added to the present electroplating baths. It is preferred that one or more leveler components is used in the present electroplating baths. Such levelers may be used in amounts of from about 0.01 to about 50 ppm. Examples of suitable leveling agents are described and set forth in U.S. Pat. Nos. 3,770,598, 4,374,709, 4,376,685, 4,555,315 and 4,673,459. In general, useful leveling agents include those that contain a substituted amino group such as compounds having R—N—R', where each R and R' is independently a substituted or unsubstituted alkyl group or a substituted or unsubstituted aryl group. Typically the alkyl groups have from 1 to 6 carbon atoms, more typically from 1 to 4 carbon atoms. Suitable aryl groups include substituted or unsubstituted phenyl or naphthyl. The substituents of the substituted alkyl and aryl groups may be, for example, alky, halo and alkoxy.

More specifically, suitable leveling agents include, but are not limited to, 1-(2-hydroxyethyl)-2-imidazolidinethione; 4-mercaptopyridine; 2-mercaptothiazoline; ethylene thiourea; thiourea; alkylated polyalkyleneimine; phenazonium compounds disclosed in U.S. Pat. No. 3,956,084; N-heteroaromatic rings containing polyrners; quaternized, acrylic, polymeric amines; polyvinyl carbamates; pyrrolidone; and imidazole. A particularly preferred leveler is 1-(2-hydroxyethyl)-2-imidazolidinethione.

The present seed layer electroplating baths may be prepared directly suitably diluting a conventional copper electroplating bath with sufficient water to provide amounts of copper ion and total acid within the above specified ranges. Electroplating baths of the present invention are advantageously used to treat or repair copper or copper alloy seed layers to provide seed layers substantially free of discontinuities. The low acid content of the present electroplating baths is suitable for use with seed layers containing an amount of oxidation. For seed layers having low to moderate oxidation, the present seed layer repair electroplating baths provide the additional advantages of removing or repairing at least a portion of such oxidized seed layer. It is preferred that the present invention provides a seed layer substantially free of discontinuities and substantially free of seed layer oxidation.

The present copper electroplating compositions are suitably used in similar manner as conventional more concentrated copper electroplating baths. Plating baths of the invention are preferably employed at a wide range of temperatures from below room temperature to above room temperature, e.g. up to 65° C. and greater. The plating composition is preferably agitated during use such as by air sparger, work piece agitation, impingement or other suitable method. Plating is preferably conducted at a current ranging from 1 to 40 ASF depending upon substrate characteristics. Plating time may range from about 2 minutes to 1 hour or more, depending on the difficulty of the work piece.

A wide variety of substrates may be plated with the compositions of the invention, as discussed above. The compositions of the invention are particularly useful to plate difficult work pieces, such as circuit board substrates with small diameter, high aspect ratio microvias and other apertures. The plating compositions of the invention also will be particularly useful for plating integrated circuit devices, such as formed semiconductor devices and the like. The compositions of the invention are particularly suitable for plating high aspect ratio microvias and trenches, such as those having aspect-rations of 4:1 or greater.

As discussed above, aspect ratios of at least 4:1, having diameters of about 200 nm or smaller have been effectively copper plated with no defects (e.g. no voids or inclusions by ion beam examination) using plating solutions of the invention. Apertures with diameters below 150 nm, or even below about 100 nm, and aspect ratios of 5:1, 6:1, 7:1, 10:1 or greater, and even up to about 15:1 or greater can be effectively plated (e.g. no voids or inclusions by ion beam examination) using plating solutions of the invention. The present invention is particularly suitable for repairing seed layers on substrates having 0.18 µm and smaller apertures.

Thus, the present invention provides a method of providing a metal seed layer substantially free of discontinuities disposed on a substrate comprising the steps of contacting a metal seed layer disposed on a substrate with an electroplating bath comprising one or more sources of copper ions and an electrolyte, wherein the copper ions are present in an amount up to 10 g/L. While not intending to be bound by theory, the present electroplating baths deposit copper in a substantially horizontal manner, such that discontinuities or voids in the seed layer are filled in or repaired preferentially to depositing copper within the apertures, i.e. the present invention does not substantially provide bottom-up fill (or superfill) of the apertures.

A wide variety of substrates may be plated with copper according to the present invention. Particularly suitable are substrates used in the manufacture of electronic devices, such as wafers used in the manufacture of integrated circuits, printed wiring board inner layers and outer layers, flexible circuits and the like. It is preferred that the substrate is a wafer.

The present invention also provides a method of manufacturing an electronic device comprising the step of contacting a metal seed layer disposed on a substrate with an electroplating bath comprising one or more sources of copper-ions and an electrolyte, wherein the copper ions are present in an amount up to 10 g/L.

Accordingly, the present invention also provides an electronic device substrate containing one or more apertures, each aperture containing a seed layer deposit obtained from an electroplating composition that includes one or more sources of copper ion and an electrolyte, wherein the copper ions are present in an amount of up to 10 g/L.

Once a seed layer is repaired according to the present invention, it is subsequently metallized to fill or substantially fill the apertures. After treatment according to the present method, the substrate, such as a wafer, may be contacted directly with a metallization bath. A rinsing step between the present seed layer repair treatment and contact with a subsequent metallization bath is optional, but is not preferred. While not intending to be bound by theory, it is believed that after contact with the present dilute electroplating bath, the apertures are protected with a low acid solution and thus may be transported directly from the seed layer repair bath to a conventional acid copper electroplating bath.

After seed layer repair treatment according to the present invention, the substrate is contacted with a conventional metallization bath, such as an acid copper bath, to fill or substantially fill the apertures. Such conventional metallization baths are well known to those skilled in the art and are generally a more concentrated form of the present electroplating baths. In such conventional acid copper baths, the copper ions are typically present in an amount of from 14 to 21 g/L with the total added acid being from about 150 to 200 g/L or more. Such metallization baths may optionally contain one or more additional components, such as those described above. After metallization, i.e. filling of the apertures, the substrate, in the case of a wafer, is preferably subjected to chemical-mechanical planarization ("CMP"). A CMP procedure can be conducted in accordance with the invention as follows.

The wafer is mounted in a wafer carrier which urges the wafer against the surface of a moving polishing pad. The polishing pad can be a conventional smooth polishing pad or a grooved polishing pad. Examples of a grooved polishing pad are described in U.S. Pat. Nos. 5,177,908; 5,020,283; 5,297,364; 5,216,843; 5,329,734; 5,435,772; 5,394,655; 5,650,039; 5,489,233; 5,578,362; 5,900,164; 5,609,719; 5,628,862; 5,769,699; 5,690,540; 5,778,481; 5,645,469; 5,725,420; 5,842,910; 5,873,772; 5,921,855; 5,888,121; 5,984,769; and European Patent 806267. The polishing pad can be located on a conventional platen which can rotate the polishing pad. The polishing pad can be held on the platen by a holding means such as, but not limited to, an adhesive, such as, two faced tape having adhesive on both sides.

A polishing solution or slurry is fed onto the polishing pad. The wafer carrier can be at a different positions on the polishing pad. The wafer can be held in position by any suitable holding means such as, but is not limited to, a wafer holder, vacuum or liquid tensioning such as, but not limited to a fluid such as, but not limited to water. If the holding means is by vacuum then there is preferably a hollow shaft which is connected to the wafer carrier. Additionally, the hollow shaft could be used to regulate gas pressure, such as, but not limited to air or an inert gas or use a vacuum to initially hold the wafer. The gas or vacuum would flow from the hollow shaft to the carrier. The gas can urge the wafer against the polishing pad for the desired contour. The vacuum can initially hold the wafer into position in the wafer carrier. Once the wafer is located on top of the polishing pad the vacuum can be disengaged and the gas pressure can be engaged to thrust the wafer against the polishing pad. The excess or unwanted copper is then removed. The platen and wafer carrier can be independently rotatable. Therefore, it is possible to rotate the wafer in the same direction as the polishing pad at the same or different speed or rotate the wafer in the opposite direction as the polishing pad.

Thus, the present invention provides a method for removing excess material from a semiconductor wafer by using a chemical mechanical planarization process which includes contacting the semiconductor wafer with a rotating polishing pad thereby removing the excess material from the semiconductor wafer; wherein the semiconductor wafer has been prior electroplated by a copper electroplating composition including at least one soluble copper salt, and an electrolyte including two or more acids.

Also provided is a method for removing excess material from a semiconductor wafer containing one or more apertures by using a chemical mechanical planarization process which includes contacting the semiconductor wafer with a rotating polishing pad thereby removing the excess material from the semiconductor wafer; wherein the apertures contain a seed layer deposit obtained from an electroplating composition that includes one or more sources of copper ion and an electrolyte, wherein the copper ions are present in an amount of up to 10 g/L.

While the present invention has been described with respect to copper electroplating baths, it will be appreciated by those skilled in the art that the present dilute electroplating bath may be used with a variety of plating baths, such as tin, tin alloy, nickel, nickel-alloy, and the like.

What is claimed is:

1. A method of providing a metal seed layer substantially free of discontinuities disposed on a substrate having apertures comprising the steps of contacting a metal seed layer having discontinuities disposed on the substrate having apertures with an electroplating bath comprising one or more sources of copper ions and an acidic electrolyte, wherein the copper ions are present in an amount up to 10 g/L.

2. The method of claim 1 wherein the copper ions are present in an amount up to 8 g/L.

3. The method of claim 1 wherein the copper ions are present in an amount of from 1 to 6 g/L.

4. The method of claim 1 wherein the source of copper ions is selected from copper sulfates, copper acetates, copper fluoroborate, or cupric nitrates.

5. The method of claim 1 wherein the amount of acid is up to 70 g/L.

6. The method of claim 1 wherein the amount of acid is from 10 to 70 g/L.

7. The method of claim 1 wherein the substrate has apertures having a diameter of about 200 nm or smaller.

8. A method of manufacturing an integrated circuit comprising the step of contacting a metal seed layer having discontinuities disposed on a substrate having apertures with an electroplating bath comprising one or more sources of copper ions and an acidic electrolyte, wherein the copper ions are present in an amount up to 10 g/L to provide a metal seed layer substantially free of discontinuities; optionally rinsing the substrate; and then contacting the substrate with a metallization bath to fill the apertures.

9. The method of claim 8 wherein the copper ions are present in an amount up to 8 g/L.

10. The method of claim 8 wherein the copper ions are present in an amount of from 1 to 6 g/L.

11. The method of claim 8 wherein the source of copper ions is selected from copper sulfates, copper acetates, copper fluoroborate, or cupric nitrates.

12. The method of claim 8 wherein the amount of acid is up to 70 g/L.

13. The method of claim 8 wherein the amount of acid is from 10 to 70 g/L.

14. The method of claim 8 wherein the substrate has apertures having a diameter of about 200 nm or smaller.

15. The method of claim 8 wherein the substrate has apertures having a diameter of 0.18 µm or smaller.

* * * * *